US012308264B2

(12) United States Patent
Kumar et al.

(10) Patent No.: US 12,308,264 B2
(45) Date of Patent: May 20, 2025

(54) RAPID TUNING OF CRITICAL DIMENSION NON-UNIFORMITY BY MODULATING TEMPERATURE TRANSIENTS OF MULTI-ZONE SUBSTRATE SUPPORTS

(71) Applicant: LAM RESEARCH CORPORATION, Fremont, CA (US)

(72) Inventors: Ravi Kumar, Beaverton, OR (US); Pulkit Agarwal, Beaverton, OR (US); Adrien Lavoie, Newberg, OR (US); Ramesh Chandrasekharan, Lake Oswego, OR (US); Michael Philip Roberts, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 730 days.

(21) Appl. No.: 17/438,639

(22) PCT Filed: Mar. 10, 2020

(86) PCT No.: PCT/US2020/021856
§ 371 (c)(1),
(2) Date: Sep. 13, 2021

(87) PCT Pub. No.: WO2020/190571
PCT Pub. Date: Sep. 24, 2020

(65) Prior Publication Data
US 2022/0223440 A1   Jul. 14, 2022

Related U.S. Application Data

(60) Provisional application No. 62/819,155, filed on Mar. 15, 2019.

(51) Int. Cl.
*H01L 21/67* (2006.01)
*C23C 16/458* (2006.01)
(Continued)

(52) U.S. Cl.
CPC .... *H01L 21/67248* (2013.01); *C23C 16/4582* (2013.01); *C23C 16/52* (2013.01);
(Continued)

(58) Field of Classification Search
CPC ................. C23C 16/4586; H01L 22/20; H01J 37/32715; H01J 37/32522; H01J 37/32724
See application file for complete search history.

(56) References Cited

U.S. PATENT DOCUMENTS 9,681,497 B2  6/2017 Nangoy et al.
2002/0125239 A1  9/2002 Chen et al.
(Continued)

FOREIGN PATENT DOCUMENTS

CN  108335993 A  7/2018
JP  2018117115 A  7/2018
(Continued)

OTHER PUBLICATIONS

Taiwan Office Action for Taiwanese Application No. 109107817 dated Sep. 20, 2023.
International Search Report and Written Opinion of the ISA issued in PCT/US2020/021856, mailed Jul. 2, 2020; ISA/KR.
First Office Action from corresponding Chinese Application No. 202080021649.5, dated Jun. 27, 2024.
(Continued)

*Primary Examiner* — Joseph A Miller, Jr.

(57) ABSTRACT

A substrate processing system includes a processing chamber, a substrate support including a plurality of heater zones arranged in the processing chamber, a gas delivery system configured to deliver process gases to the processing chamber, and a controller configured to communicate with the gas delivery system and the plurality of heater zones, initiate a first treatment step of a process during a transient temperature period after a substrate is arranged on the substrate support and prior to the substrate reaching a steady-state temperature of the substrate support, and adjust heating to each of the plurality of heater zones during the first treatment (Continued)

step based on average heat functions determined for corresponding ones of the plurality of heater zones during a period corresponding to the first treatment step.

7 Claims, 8 Drawing Sheets

(51) Int. Cl.
  *C23C 16/52* (2006.01)
  *H01J 37/32* (2006.01)
  *H01L 21/66* (2006.01)

(52) U.S. Cl.
  CPC .... *H01J 37/3244* (2013.01); *H01J 37/32522* (2013.01); *H01L 22/20* (2013.01); *H01J 2237/332* (2013.01); *H01J 2237/334* (2013.01)

(56) References Cited

U.S. PATENT DOCUMENTS

| 2006/0185600 | A1* | 8/2006 | Donis | C23C 16/4586 |
| | | | | 118/728 |
| 2013/0270252 | A1 | 10/2013 | Ambal et al. | |
| 2015/0168962 | A1 | 6/2015 | Waldmann et al. | |

FOREIGN PATENT DOCUMENTS

| KR | 20140099838 A | 8/2014 |
| TW | 201448025 A | 12/2014 |
| TW | 201537318 A | 10/2015 |

* cited by examiner

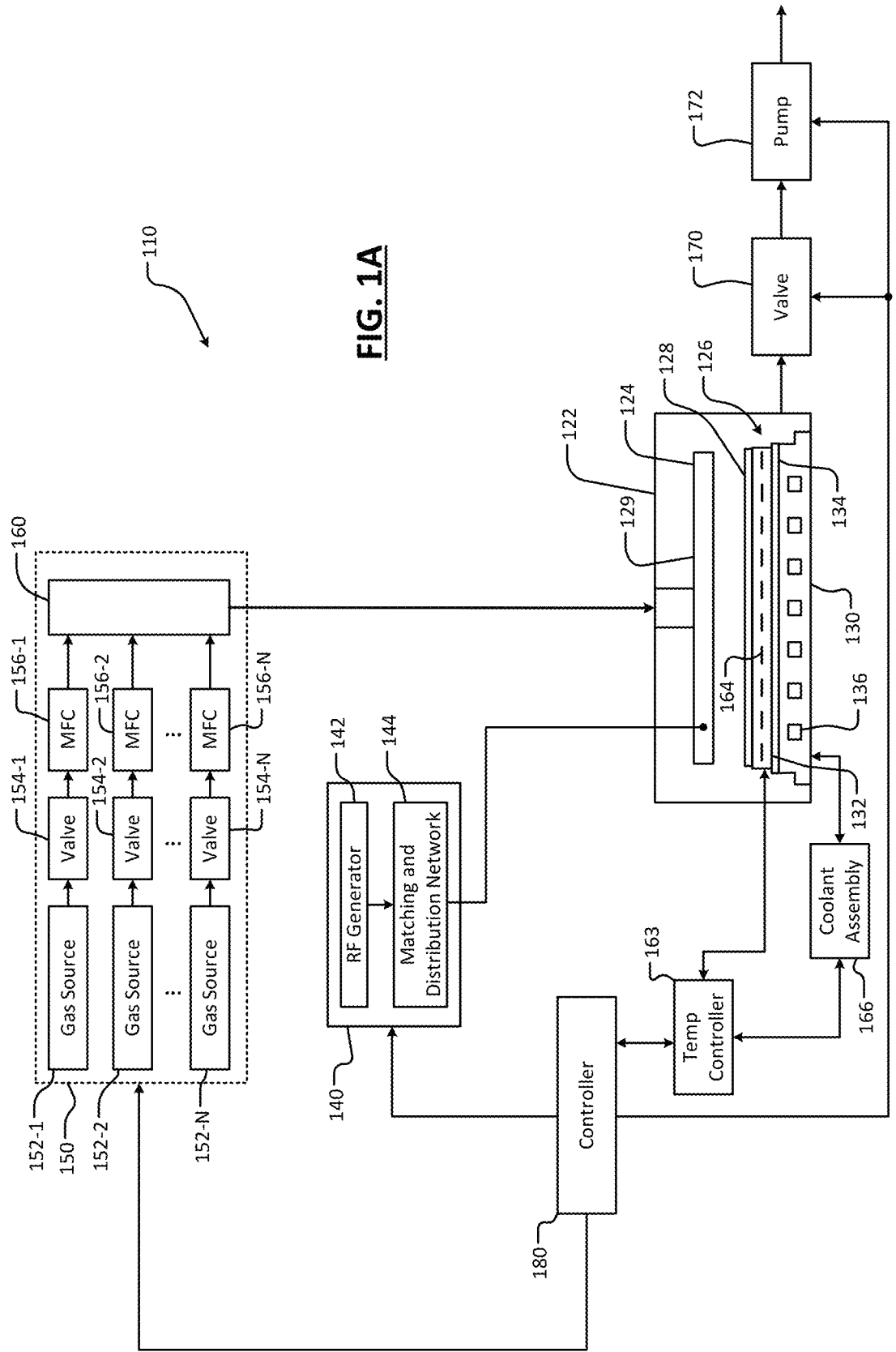

RAPID TUNING OF CRITICAL DIMENSION NON-UNIFORMITY BY MODULATING TEMPERATURE TRANSIENTS OF MULTI-ZONE SUBSTRATE SUPPORTS

CROSS-REFERENCE TO RELATED APPLICATIONS

This application is a U.S. National Phase Application under 35 U.S.C. 371 of International Application No. PCT/US2020/021856, filed on Mar. 10, 2020, which claims the benefit of U.S. Provisional Application No. 62/819,155, filed on Mar. 15, 2019. The entire disclosures of the applications referenced above are incorporated herein by reference.

FIELD

The present disclosure relates to substrate processing systems and more particularly to substrate processing systems including multi-zone substrate supports.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems perform treatments on substrates such as semiconductor wafers. Examples of substrate treatments include deposition, ashing, etching, cleaning and/or other processes. Process gas mixtures may be supplied to the processing chamber to treat the substrate. Plasma may be used to ignite the gases to enhance chemical reactions.

Cycle times for processing substrates determine the throughput of the substrate processing system and the cost of each of the substrates produced therein. When processing the substrates, some steps such as deposition and etching can be affected by local variations in temperature of portions of the substrate.

SUMMARY

A substrate processing system includes a processing chamber, a substrate support including a plurality of heater zones arranged in the processing chamber, a gas delivery system configured to deliver process gases to the processing chamber, and a controller configured to communicate with the gas delivery system and the plurality of heater zones, initiate a first treatment step of a process during a transient temperature period after a substrate is arranged on the substrate support and prior to the substrate reaching a steady-state temperature of the substrate support, and adjust heating to each of the plurality of heater zones during the first treatment step based on average heat functions determined for corresponding ones of the plurality of heater zones during a period corresponding to the first treatment step.

In other features, the substrate processing system further includes a plasma generator configured to generate plasma in the processing chamber and the controller is further configured to cause the plasma generator to generate plasma during the first treatment step. The first treatment step comprises etching. The first treatment step comprises deposition. The controller is further configured to adjust heating during the first treatment step using a first set of heater adjustment parameters.

In other features, the controller is further configured to initiate a second treatment step of the process one of before or after the first treatment step and during the transient temperature period and adjust heating to each of the plurality of heater zones during the second treatment step based on an average heat function determined for corresponding ones of the plurality of heater zones during a period corresponding to the second treatment step. The controller is further configured to adjust heating during the second treatment step using a second set of heater adjustment parameters different than the first set of heater adjustment parameters. The first treatment step includes an etch step and the second treatment step includes a deposition step.

In other features, the average heat function for one of the plurality of heater zones is based on an integral of temperature over a period of the first treatment step for the corresponding one of the plurality of heater zones. The process comprises a multi-patterning process.

A method of processing a substrate in a processing chamber includes arranging the substrate on a substrate support including a plurality of heater zones within the processing chamber, initiating a first treatment step of a process during a transient temperature period after the substrate is arranged on the substrate support and prior to the substrate reaching a steady-state temperature of the substrate support, and adjusting heating to each of the plurality of heater zones during the first treatment step based on average heat functions determined for corresponding ones of the plurality of heater zones during a first period corresponding to the first treatment step.

In other features, method further includes, prior to arranging the substrate on the substrate support, setting a temperature of the substrate support, arranging a test substrate on the substrate support, determining temperatures of the test substrate corresponding to the plurality of heater zones for the first period, and determining the average heat functions for the corresponding ones of the plurality of heater zones during the first period. The first treatment step comprises one of etching and deposition. The method further includes adjusting heating during the first treatment step using a first set of heater adjustment parameters.

In other features, the method further includes initiating a second treatment step of the process one of before or after the first treatment step and during the transient temperature period and adjusting heating to each of the plurality of heater zones during the second treatment step based on an average heat function determined for corresponding ones of the plurality of heater zones during a second period corresponding to the second treatment step. The method further includes adjusting heating during the second treatment step using a second set of heater adjustment parameters that is different than the first set of heater adjustment parameters. The first treatment step comprises an etch step and the second treatment step comprises a deposition step.

In other features, the average heat function for one of the plurality of heater zones is based on an integral of temperature over a period corresponding to the first treatment step for the corresponding one of the plurality of heater zones. The process comprises a multi-patterning process. The method further includes, subsequent to the first treatment step, measuring at least one parameter of the substrate and adjusting, based on the at least one parameter, a first set of heater adjustment parameters used to heat the substrate support during the first treatment step.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is a functional block diagram of an example of a substrate processing system according to the present disclosure;

In the drawings, reference numbers may be reused to identify similar and/or identical elements.

DETAILED DESCRIPTION

Figure 1B:
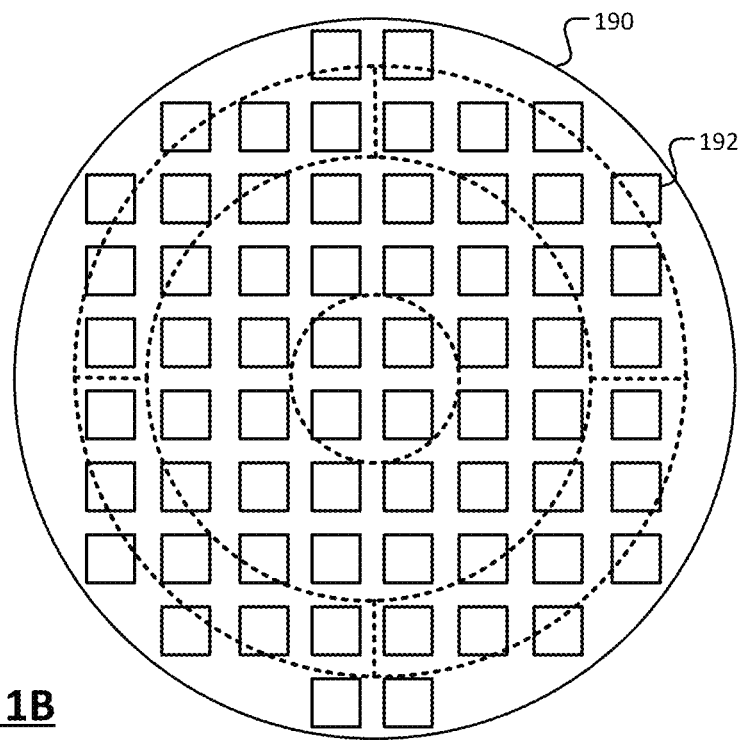
FIG. 1B illustrates an example of a substrate including a plurality of wireless thermocouples according to the present disclosure.

When a substrate is initially arranged on the substrate support, it may take 2-3 minutes or longer before the substrate reaches a steady-state temperature of the substrate support (e.g. the transient period). Delaying processing during the transient period significantly increases the cycle time and cost of fabricating the substrate. However, proceeding with processing prior to the substrate reaching the steady-state temperature of the substrate support may cause critical dimension non-uniformity (CD NU).

Substrate processing systems and methods according to the present disclosure perform one or more treatment steps on substrates during the transient temperature period. Prior to processing substrates, a test substrate is arranged on the substrate support and temperatures at various locations of the test substrate are recorded during the transient period after the substrate is arranged on the substrate support (and the substrate has not reached the steady-state temperature of the substrate support) until the substrate reaches the steady-state temperature of the substrate support. For example, the test substrate may include temperature sensors (e.g., thermocouples) arranged on the substrate support and temperatures of each of the thermocouples are recorded during the transient period. In some examples, the test substrate may not include temperature sensors and instead the temperatures of the test substrate may be sensed or measured by a device within the processing chamber (e.g., a thermal imaging device such as an infrared sensor).

An average heat function is determined for each of the heater zones as a function of time. The average heat function corresponds to an area under a temperature curve (e.g. an integral of temperature during the period of the corresponding treatment step). Critical dimension non-uniformity of a heater zone is well correlated with the average heat function in the heater zone when the treatment step is performed.

For example, a trim step may be performed on a substrate during a multi-patterning process. The trim step is performed during the transient period after the substrate is positioned on the substrate support and prior to the substrate reaching the steady-state temperature of the substrate support. The average heat function of each of the heater zones during the trim step is used to adjust heating in the corresponding heater zone to reduce CD NU. A similar approach can be used for deposition or other treatment steps performed during the transient period. In some examples, one set of heater adjustments is made for a trim step and another set of heater adjustments is made for a deposition step preceding or following the trim step due to the differences in the effect of temperature variations on etching relative to deposition.

Referring now to FIG. 1A, an example of a substrate processing system is shown. While a specific processing chamber is shown, other types of processing chambers can be used. The substrate processing system 110 includes a processing chamber 122 that encloses other components of the substrate processing system 110 and contains the RF plasma (if used). The substrate processing system 110 includes an upper electrode 124 and a substrate support 126 such as an electrostatic chuck (ESC). During processing, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A thermal resistance layer 134 may be arranged between the heating plate 132 and the baseplate 130. The baseplate 130 may include one or more channels 136 for flowing coolant through the baseplate 130. While a specific type of substrate support is shown, other types of substrate supports or heaters can be used.

A plasma generating system 140 generates plasma by outputting an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the plasma generating system 140 may include an RF generator 142 that generates RF plasma power that is fed by a matching and distribution network 144 to the upper electrode 124 or the baseplate 130. In other examples, the plasma may be generated inductively or remotely.

A gas delivery system 150 includes one or more gas sources 152-1, 152-2, . . . , and 152-N (collectively gas sources 152), where N is an integer greater than zero. The gas sources 152 are connected by valves 154-1, 154-2, . . . , and 154-N (collectively valves 154) and MFCs 156-1, 156-2, . . . , and 156-N (collectively MFCs 156) to a manifold 160. Secondary valves may be used between the MFCs 156 and the manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the substrate support 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the substrate support 126.

A valve 170 and pump 172 may be used to evacuate reactants from the processing chamber 122. A system controller 180 may be used to control components of the substrate processing system 110.

Referring now to FIG. 1B, substrate temperature is measured during a transient period that occurs after the substrate is placed on the substrate support and until the point in time after the substrate reaches a steady state temperature of the substrate support. A test substrate 190 includes a plurality of thermocouples 192. In some examples, the plurality of thermocouples 192 are connected to one or more wireless transmitters that transmit temperature measurements for the corresponding locations. In some examples, the temperature measurements are associated with one or more of the plurality of heater zones in the substrate support (shown in FIGS. 1A and 1C). In some examples, the test substrate 190 may not include the plurality of thermocouples 192. Instead, the temperatures of the test substrate 190 may be sensed or measured by a device within the processing chamber 122 (e.g., a thermal imaging device such as an infrared sensor arranged to capture images indicating a thermal distribution across a surface of the test substrate 190).

Figure 1C:
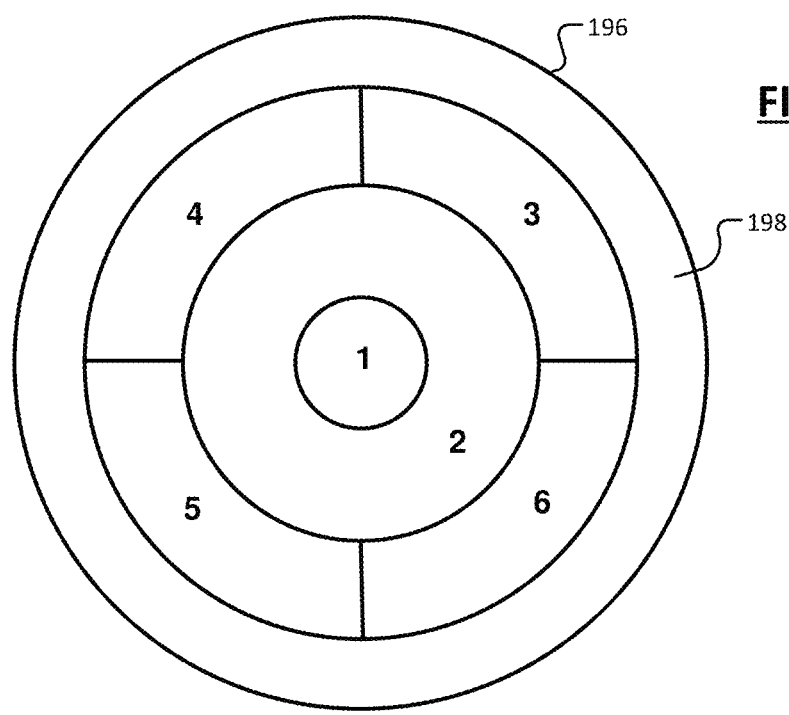
FIG. 1C is a plan view illustrating an example of a substrate support with multiple heater zones according to the present disclosure.

Referring now to FIG. 1C, a substrate support 196 includes a plurality of heater zones 198. In this example, a circular inner heater zone 1 is surrounded by an annular heater zone 2. The annular heater zone 2 is surrounded by heater zones 3-6, which correspond to annular heater zone segments of another annular heater zone. While a specific number and/or orientation of the plurality of heater zones 198 is shown, other numbers of heater zones and/or orientations may be used.

Figure 2A:
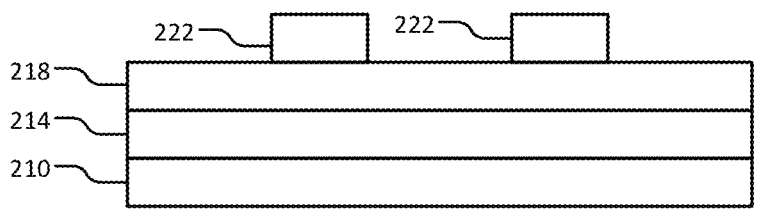
FIGS. 2A to 2H are side cross-sectional views of an example of a substrate during multi-patterning according to the present disclosure.
Figure 2B:
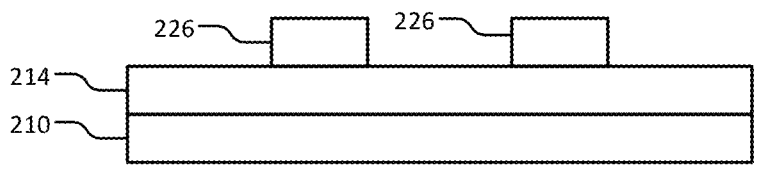
Figure 2C:
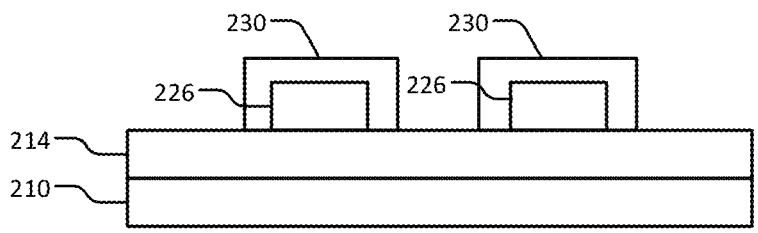

Referring now to FIGS. 2A to 2H, a substrate is shown during a multi-patterning process. In FIG. 2A, a substrate includes a target layer 210, a core layer 214, a core layer 218 and a mandrel pattern layer 222. In FIG. 2B, an isotropic etch step is performed to etch the core layer 218 and features 226 are defined in the core layer 218 in accordance with the mandrel pattern layer 222 (which may be subsequently removed). In FIG. 2C, a first conformal deposition step is performed to selectively deposit a layer 230 on the features 226 arranged on the core layer 214. In some examples, the layer 230 is deposited (using selective atomic layer deposition (ALD) of a material such as silicon dioxide, silicon nitride, etc.) onto the features 226. Selective deposition refers to deposition that occurs on a first exposed material more than on a second exposed material that is different than the first exposed material.

Figure 2D:
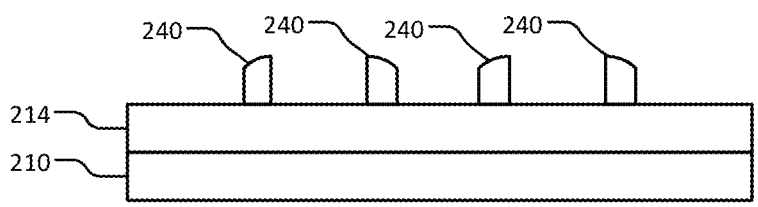
Figure 2E:
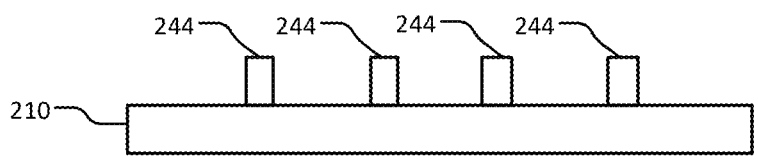
Figure 2F:
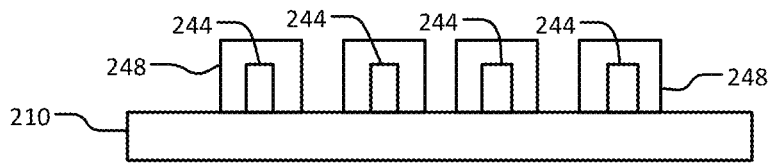

In FIG. 2D, etching is performed to remove the features 226 and to define spacers 240. In FIG. 2E, isotropic etching is performed to define spacers (e.g., square spacers) 244 in the core layer 214. In FIG. 2F, a second conformal deposition step is performed to selectively deposit a conformal layer 248 on the square spacers 244 arranged on the target layer 210.

Figure 2G:
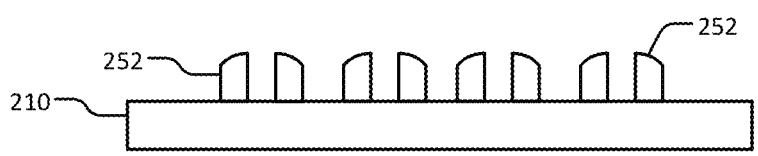
Figure 2H:
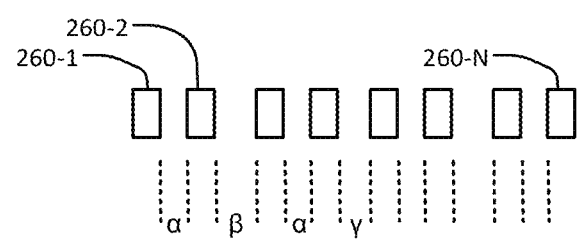

In FIG. 2G, etching is performed to remove the square spacers 244 and to define spacers 252 (that are spaced closer than the square spacers 244) on the target layer 210. In FIG. 2H, isotropic etching is performed to pattern features 260-1, 260-2, . . . , and 260-N (collectively features 260) (where N is an integer) in the target layer 210 with a critical dimension defined between the features 260.

Figure 3A:
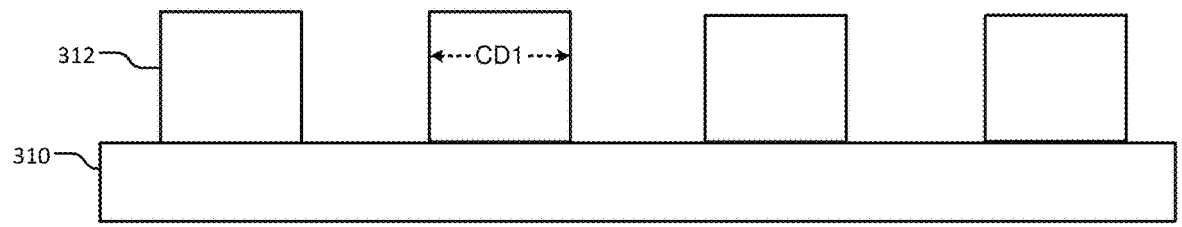
FIGS. 3A to 3D illustrate critical dimension imbalance and other parameters used during multi-patterning according to the present disclosure.
Figure 3B:
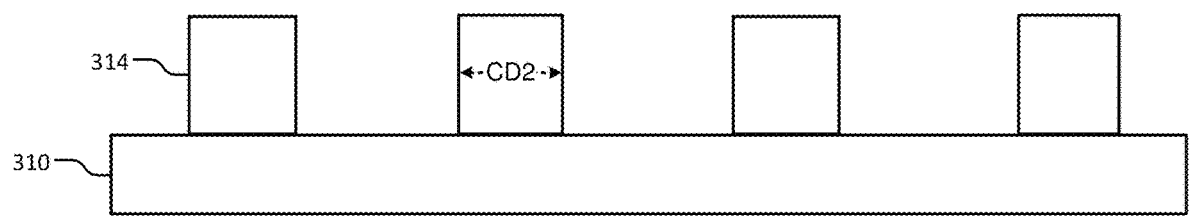

Referring now to FIGS. 3A to 3D, CD imbalance and other parameters that are used during multi-patterning are illustrated. In FIG. 3A, a substrate includes an underlying layer 310. Features 312 on the underlying layer 310 are shown prior to a trim step (pre-trim). The feature 312 have a width equal to a first critical dimension (CD1). In FIG. 3B, the substrate is shown after the trim step (post-trim). Narrower features 314 now have a width equal to a second critical dimension (CD2), where CD2<CD1.

Figure 3C:
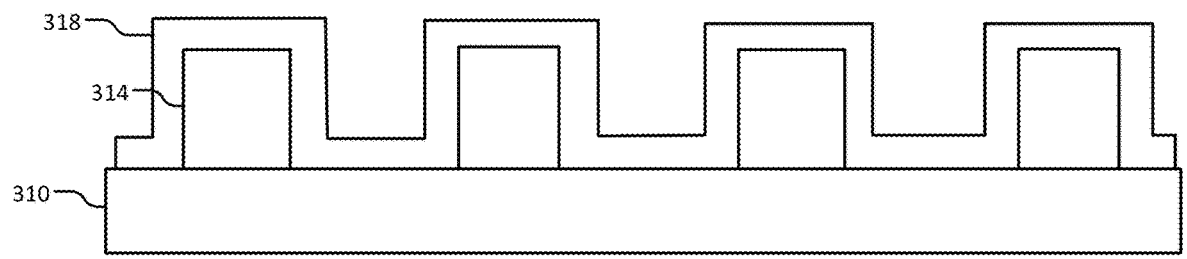
Figure 3D:
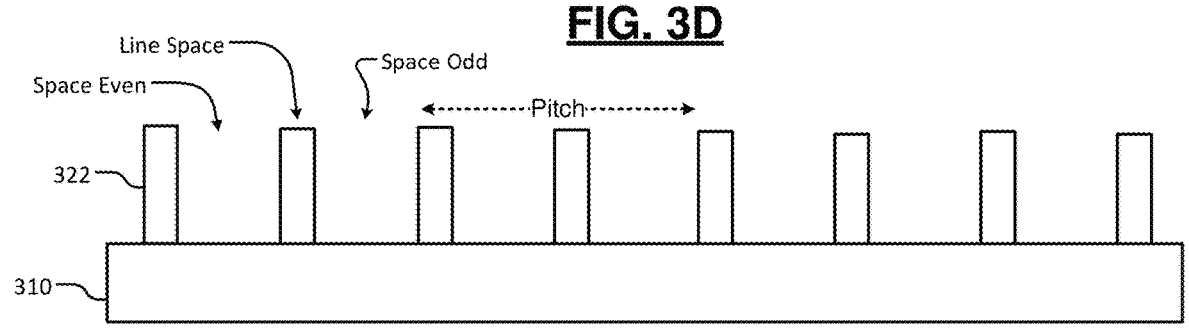

In FIG. 3C, a conformal layer 318 is deposited on the features 314. In some examples, the conformal layer 318 is deposited using ALD. In some examples, the conformal layer 318 includes silicon oxide. Etching is performed to remove the spacers 314 and define features 322 on the underlying layer 310 as shown in FIG. 3D.

Spaces located in areas below the spacers 314 correspond to even spaces and other spaces correspond to odd spaces. Pitch is defined as (2*line space+space even+space odd). Critical dimension imbalance (CD IMB) is equal to an absolute value of a difference between space even and space odd. Space odd is a function of trim rate and photoresist consumption during deposition. Line width is a function of ALD thickness after etch. Space 2 is a function of Space 1 and line width.

Figure 4:
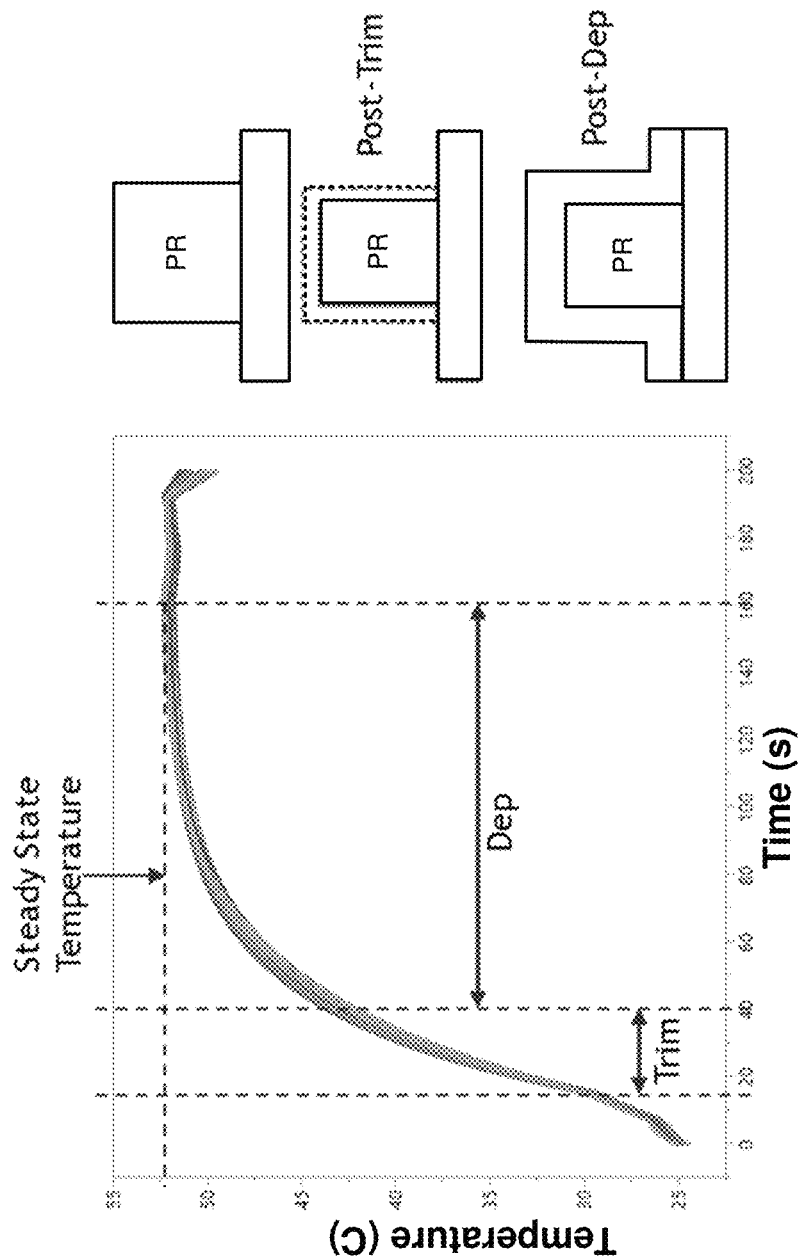
FIG. 4 is a graph illustrating a temperature of heater zones of the substrate as a function of time during heating of a substrate after placement on the substrate support until the substrate reaches a steady state temperature of the substrate support according to the present disclosure.

Referring now to FIG. 4, a graph illustrates a temperature of a substrate as a function of time during heating of the substrate after placement on the substrate support and until the substrate reaches a steady state temperature of the substrate support. To reduce cycle times and increase throughput, the trim and deposition steps are performed prior to the substrate reaching a steady-state temperature of the substrate support. In one example, the substrate does not reach the steady-state temperature of the substrate support until after 160s or another transient period. If the process is delayed until the substrate reaches the steady-state temperature of the substrate support, then the process will be slowed considerably.

However, both trim and deposition steps are affected by variations in substrate temperature. The substrate support is typically kept at a uniform temperature. Different portions of the substrate will warm up to a steady-state temperature of the substrate support at different rates. Each of these temperature variations may cause differences in critical dimensions of features (e.g., photoresist (PR) features) defined on the substrate. As can be seen in FIG. 4, a trim step occurs at lower temperatures than a deposition step (and both are initiated or performed prior to the substrate reaching the steady-state temperature of the substrate support).

Figure 5:
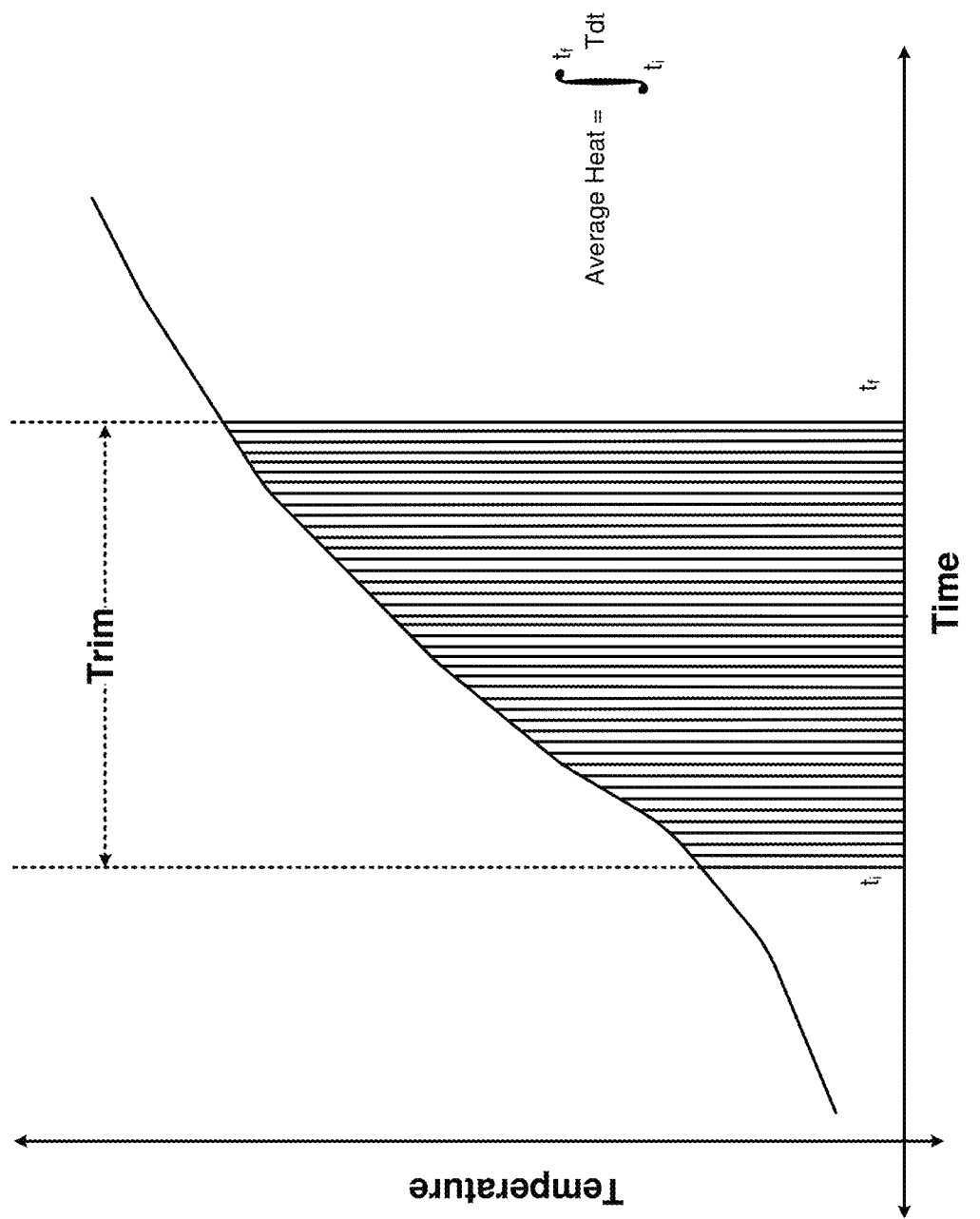
FIG. 5 is a graph illustrating temperature of a heater zone of the substrate as a function of time during a trim step prior to the substrate reaching a steady state temperature of the substrate support according to the present disclosure.

Referring now to FIG. 5, a graph illustrating a temperature of the substrate as a function of time during a trim step prior to the substrate reaching a steady state temperature of the substrate support is shown. Temperature values are recorded as a function of time for different locations of the test substrate 190 including thermocouples 192 after the substrate is placed on the substrate support until the point after the substrate reaches a steady-state temperature of the substrate support.

For example, a portion of the temperature curve corresponds to a time when a trim or deposition step is performed. An average heat value is calculated by integrating an area under the temperature curve during the trim or deposition step. The average heat value calculation is performed for each thermocouple. Then, the average heat values for each heater zone of the multi-zone substrate support are calculated based on thermocouples affecting the corresponding heater zone. The average heat values for each heater zone are used to adjust heat in the heater zone to correct CD NU in the heater zone during the trim step. The process may be repeated for other steps occurring before the substrate reaches the steady-state temperature of the substrate support.

Figure 6:
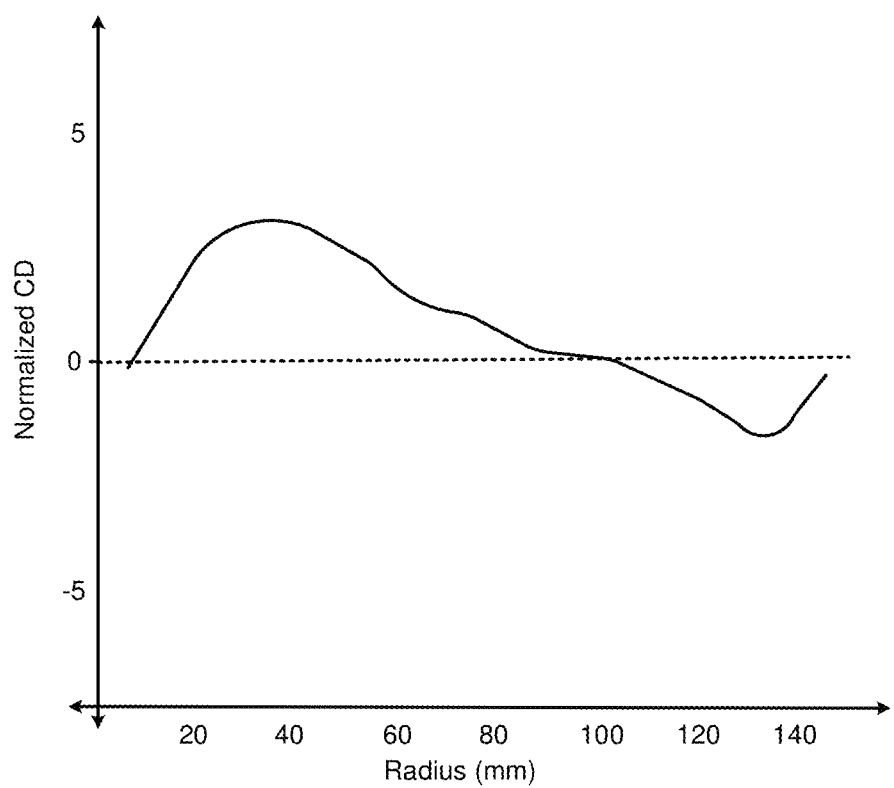
FIG. 6 is a graph illustrating a normalized critical dimension as a function of substrate radius for a radial portion of the substrate according to the present disclosure.
Figure 7:
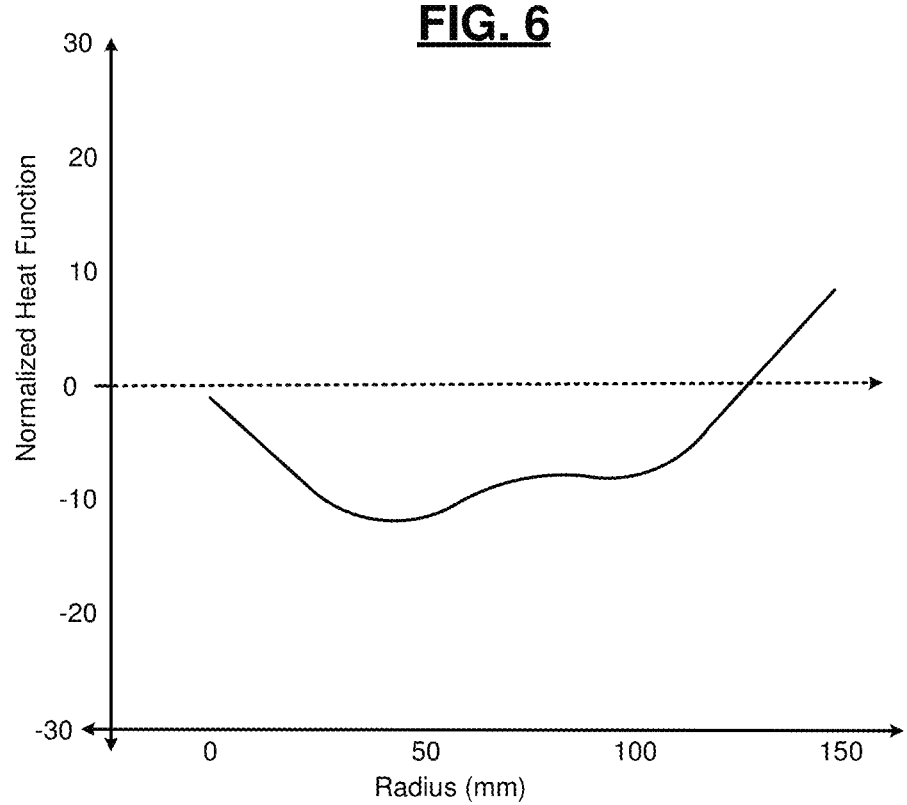
FIG. 7 is a graph illustrating normalized heat function as a function of substrate radius for a radial portion of the substrate according to the present disclosure.

Referring now to FIGS. 6 and 7, the normalized heat function can be used to adjust heating in a heater zone to adjust critical dimensions of features in the heater zone during steps performed prior to the substrate reaching steady state temperature of the substrate support. In FIG. 6, a graph illustrates an example of a normalized critical dimension as a function of substrate radius for a portion of the substrate support. In FIG. 7, a graph illustrates normalized heat function as a function of substrate radius for the same portion of the substrate support.

As can be seen, there is a correlation between the normalized CD and the normalized heat function. In this case, there is an inverse correlation between the normalized heat function and the normalized CD. In other words, as the normalized heat function decreases in a particular location, the normalized CD increases and vice versa. Using this information, the heating in the heater zones can be adjusted to provide more uniform CD during a treatment step performed prior to the substrate reaching the steady-state temperature of the substrate support.

Figure 8:
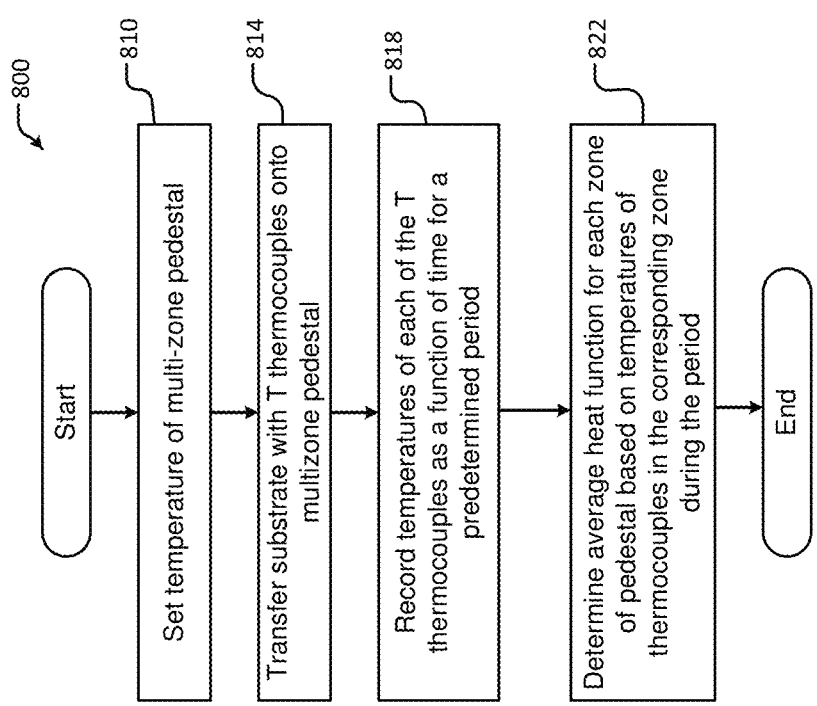
FIG. 8 is a flowchart of an example method for determining an average heat function for heater zones of a multi-zone substrate support during the transient period according to the present disclosure.

Referring now to FIG. 8, a method 800 for determining an average heat function for heater zones of a multi-zone substrate support is shown. As described above, the average heat function is determined for periods that occur after placement of the substrate on the substrate support until the substrate reaches a steady state temperature of the substrate support.

The method 800 includes setting a temperature of a multi-zone substrate support to a process temperature at 810. At 814, the test substrate 190 including T thermocouples 192 is arranged on the substrate support. At 818, the temperature of each of the thermocouples is recorded as a function of time for a predetermined period that includes a period when a trim step, a deposition step or other treatment step will occur prior to the substrate reaching a steady-state temperature of the substrate support. At 822, an average heat function for each heater zone of the substrate support is determined based on the temperatures of thermocouples in the corresponding heater zones during the period.

Figure 9:
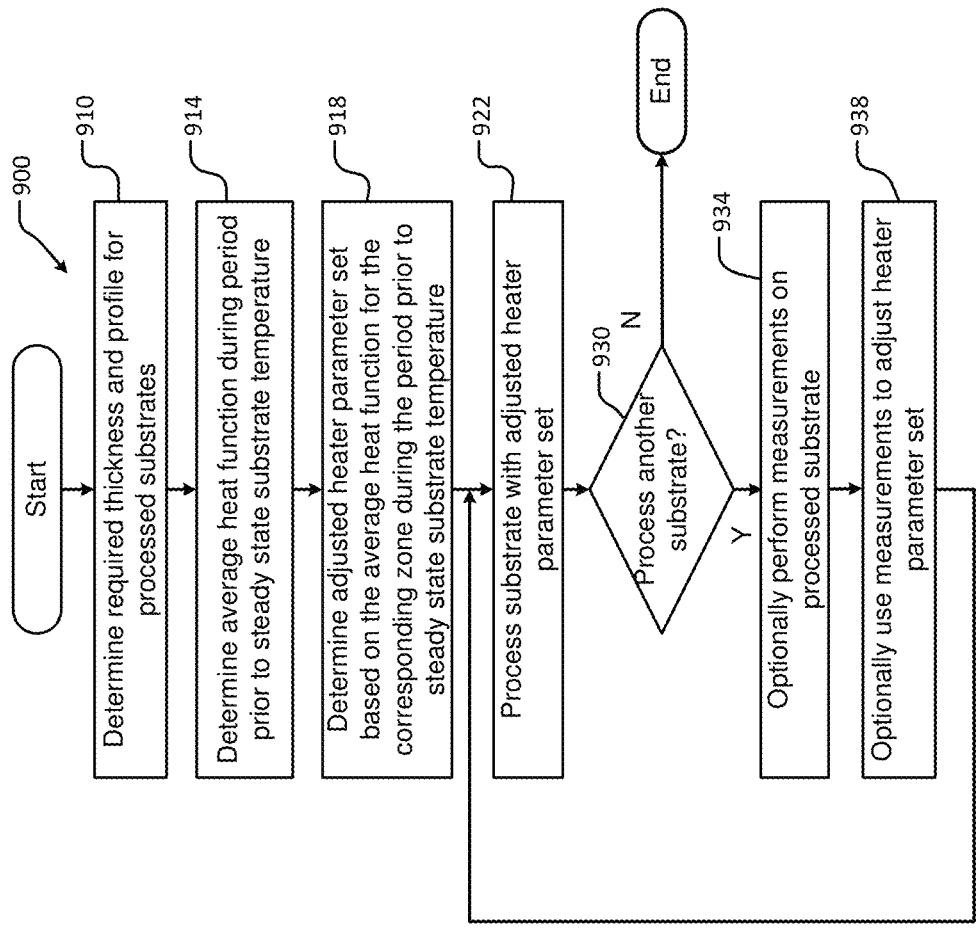
FIG. 9 is a flowchart of an example method for using the average heat function to adjust heating to reduce critical dimension non-uniformity during a treatment step performed prior to the substrate reaching a steady state temperature of the substrate support according to the present disclosure.

Referring now to FIG. 9, a method 900 for using the average heat function to adjust heating to reduce CD NU is shown. The trim step (or other step) occurs during a period prior to the substrate reaching a steady state temperature of the substrate support. The method 900 includes determining a required thickness and profile for the substrate (e.g., a patterned substrate) at 910. At 914, an average heat function is determined during the trim step (or other treatment step) for each heater zone. For example, the average heat function is determined in accordance with the average heat functions previously determined as described in FIG. 8. The average heat functions as previously determined may be stored in and retrieved from memory. At 918, a heater parameter set is adjusted during the trim step (or other treatment step) based on the average heat function for the corresponding heater zone. In other words, heat parameters used to control the temperatures in each heater zone are adjusted in accordance with the average heat function. At 922, the substrate is processed with the adjusted heater parameter set.

At 930, the method 900 determines whether another substrate is to be processed. At 934, the processed substrate can optionally be measured. For example, critical dimensions or other parameters can be measured. At 938, the measurements can be used to further adjust the heater parameter set. Alternately, 934 and 938 can be omitted.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their step before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and step settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control step, enable cleaning steps, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining stepal parameters for carrying out a particular process on or for a semiconductor wafer or to a system. The stepal parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication steps, examine a history of past fabrication steps, examine trends or performance metrics from a plurality of fabrication steps, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more steps. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
   a processing chamber;
   a substrate support including a plurality of heater zones arranged in the processing chamber;
   a gas delivery system configured to deliver process gases to the processing chamber; and
   a controller configured to:
     communicate with the gas delivery system and the plurality of heater zones;
     initiate a first treatment step of a process during a transient temperature period after a substrate is arranged on the substrate support and prior to the substrate reaching a steady-state temperature of the substrate support, wherein the first treatment step includes performing a trim step using process gases from the gas delivery system to modify features on the substrate, and the features each define a critical dimension;
     initiate a deposition step after the trim step, wherein a temperature of the substrate during the deposition step is greater than the temperature of the substrate during the trim step and less than the steady-state temperature of the substrate support;
     for each of the plurality of heater zones, determine an average heat function for the heater zone according to an integral of temperature of the heater zone during the transient temperature period after a substrate is arranged on the substrate support and prior to the substrate reaching the steady-state temperature of the substrate support; and
     adjust heating to each of the plurality of heater zones during the first treatment step by increasing heating supplied to each heater zone having a determined average heat function corresponding to feature critical dimensions above a normalized critical dimension of features of the substrate, based on an inverse correlation between the average heat functions and the normalized critical dimension, to generate uniform critical dimensions of the features in each of the plurality of heater zones, wherein the average heat functions are determined for corresponding ones of the plurality of heater zones during the transient temperature period corresponding to the first treatment step.

2. The substrate processing system of claim 1 further comprising:

a plasma generator configured to generate plasma in the processing chamber, wherein the controller is further configured to cause the plasma generator to generate plasma during the first treatment step.

3. The substrate processing system of claim 1, wherein the first treatment step comprises etching.

4. The substrate processing system of claim 1, wherein the controller is further configured to execute a first heater adjustment during the first treatment step.

5. The substrate processing system of claim 4, wherein the controller is further configured to:

adjust heating to each of the plurality of heater zones during the deposition step based on an average heat function determined for corresponding ones of the plurality of heater zones during a second transient temperature period corresponding to the second deposition step.

6. The substrate processing system of claim 5, wherein the controller is further configured to execute a second heater adjustment during the deposition step, wherein the second heater adjustment is different than the first heater adjustment.

7. The substrate processing system of claim 1, wherein the process comprises a multi-patterning process.

\* \* \* \* \*